United States Patent
Meth

(10) Patent No.: US 7,408,263 B2
(45) Date of Patent: Aug. 5, 2008

(54) ANISOTROPIC CONDUCTIVE COATINGS AND ELECTRONIC DEVICES

(75) Inventor: Jeffrey Scott Meth, Landenberg, PA (US)

(73) Assignee: E.I. Du Pont de Nemours and Company, Wilmington, DE (US)

( * ) Notice: Subject to any disclaimer, the term of this patent is extended or adjusted under 35 U.S.C. 154(b) by 68 days.

(21) Appl. No.: 11/417,860

(22) Filed: May 3, 2006

(65) Prior Publication Data

US 2006/0249301 A1    Nov. 9, 2006

Related U.S. Application Data

(60) Provisional application No. 60/677,044, filed on May 3, 2005.

(51) Int. Cl.
*H01L 23/48*   (2006.01)
*H01L 23/52*   (2006.01)
*H01L 29/40*   (2006.01)

(52) U.S. Cl. ............................... 257/783; 438/118
(58) Field of Classification Search .......... 257/782, 257/783, 40, 789, 795; 438/118, 119; 427/207.1, 427/208, 208.2, 208.4
See application file for complete search history.

(56) References Cited

U.S. PATENT DOCUMENTS

| | | | |
|---|---|---|---|
| 2007/0048970 A1* | 3/2007 | Suzuki et al. | 438/455 |
| 2007/0059901 A1* | 3/2007 | Majumdar et al. | 438/455 |
| 2007/0090387 A1* | 4/2007 | Daniels | 257/99 |
| 2007/0139848 A1* | 6/2007 | Harris et al. | 361/118 |
| 2007/0207560 A1* | 9/2007 | LeCain et al. | 438/22 |

* cited by examiner

*Primary Examiner*—S. V. Clark

(57) ABSTRACT

Anisotropic conductive coatings and electronic devices made using the coatings are provided. The anisotropic conductive coatings are particularly useful in electronic devices that contain flexible substrates.

20 Claims, 5 Drawing Sheets

ANISOTROPIC CONDUCTIVE COATINGS AND ELECTRONIC DEVICES

FIELD OF THE INVENTION

The present invention relates to anisotropic conductive coatings and electronic devices made using the anisotropic conductive coatings. Specifically, the present invention relates to anisotropic conductive coatings useful in electronic devices that contain flexible substrates.

BACKGROUND

Anisotropic conductive films and coatings generally include an anisotropic non-conductive matrix and conductive particles. The films and coatings can also include adhesives as a non-conductive component. The adhesives typically bind the electrical components in electronic devices, e.g. flip-chips, while the conductive particles dispersed in the adhesive provide a conductive media between the electrical components. Conductive adhesives are typically used as films in the manufacture of devices such as circuit boards and display modules.

In the past, anisotropic conductive films were used in the flat panel display industry to make the electrical and mechanical connections from the drive electronics to the glass substrates of displays. More recently, the films are also being used to make connections between two or more electronic components, such as integrated circuits and circuit boards.

JP 11-135561 discloses an anisotropic conductive adhesive film comprising an elastic conductive particle in a film that consists of a thermosetting adhesive. The diameter of the elastic conductive particle is slightly larger than the thickness of the film of the thermosetting adhesive.

JP 08-007658 discloses an insulating adhesive film in which conductive particulates are uniformly dispersed. The conductive particulates are porous spherical polymer particulates having an average particle diameter of 2 to 20 μm, and are coated with metal.

U.S. Pat. No. 5,636,996 discloses an anisotropic interposer layer comprising a plastic layer (preferably a polyamide polymer) and a plurality of electrically conducting particles disposed in a random pattern throughout the plastic layer. The individual particles extend from one surface of the interposer layer to the other surface, preferably outwardly from the surfaces.

Other anisotropic conductive films have been disclosed that require high temperatures and/or pressures in order to provide adhesion and connection between the layers between which they are interposed. Anisotropic adhesive films have also been disclosed that have a thickness greater than the diameter of conductive particles present in it. The film thickness is reduced only when the layers on either side compress the adhesive film such that the conductive particles come in contact with the layers.

Thus, even though various anisotropic conductive films exist in the art, there is a need for anisotropic conductive films that have a thickness less than the diameter of conductive particles dispersed in them, that can be produced by a simple method, that can be used on flexible substrates, that are compatible with organic conducting materials, and that do not require high temperatures and pressures for providing connection and adhesion. Furthermore, there is a need for anisotropic conductive films that allow the preparation of complex circuitry.

SUMMARY OF THE INVENTION

One aspect of the present invention is a device comprising:
a. a first electrical element comprising a flexible substrate and a patterned organic conductor or patterned organic semiconductor element on a first side of the flexible substrate;
b. a second electrical element comprising a second substrate and an element selected from patterned organic conductor elements, patterned inorganic conductor elements and patterned semiconductor elements, on a first side of a second substrate;
c. a coating composition in contact with the patterned organic conductor or patterned organic semiconductor element of the first electrical element and the patterned organic conductor element, patterned inorganic conductor element or patterned semiconductor element of the second electrical element, wherein the coating composition comprises an adhesive and a plurality of conductive particles dispersed within the adhesive, and wherein the average diameter of the conductive particles is greater than the thickness of the coating and the conductive particles fill less than about 50 percent of the total volume of the coating composition.

Another aspect of the invention is a method comprising:
a. providing a first electrical element comprising a flexible substrate and a patterned organic conductor or patterned organic semiconductor element on a first side of the flexible substrate, and a second electrical element comprising a second substrate and an element selected from patterned organic conductor elements, patterned inorganic conductor elements and patterned semiconductor elements, on a first side of a second substrate;
b. providing a coated element by forming a coating on the patterned element of one of the first and second elements, wherein the coating comprises an adhesive and a plurality of conductive particles dispersed within the adhesive, and wherein the average diameter of the conductive particles is greater than the thickness of the coating and the conductive particles fill less than about 50 percent of the total volume of the coating composition.;
c. contacting the patterned element of the other element of the first and second elements with the coating of the coated element to form an assembly; and
d. applying sufficient pressure to the assembly so that at least a portion of the conductive particles make contact with both the patterned element of the first electrical element on the first substrate and the patterned element of the second electrical element on the second substrate.

DETAILED DESCRIPTION

Figure 1A:
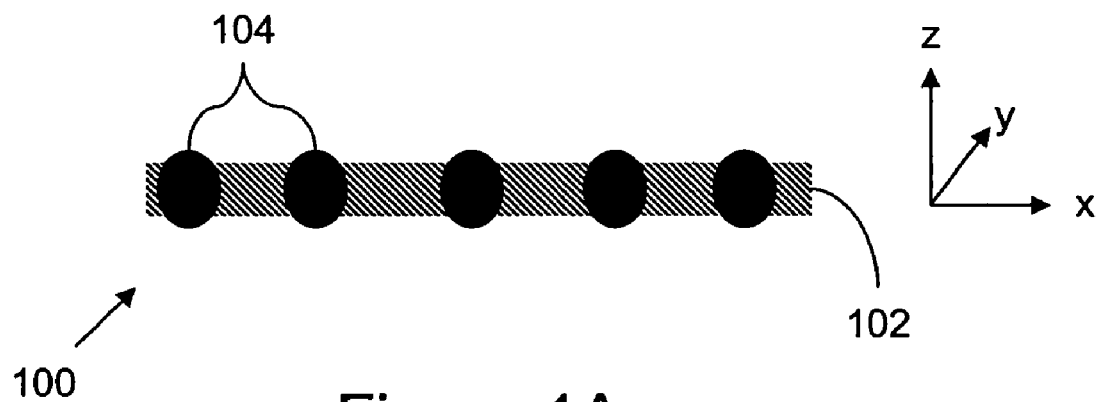
FIGS. 1A and 1B depict the side view and the top view of an anisotropic conductive film, in accordance with one embodiment of the invention.

The present invention provides compositions, devices and methods utilizing flexible substrates and conductor and semiconductor materials.

In preferred embodiments the device comprises: first electrical element comprising a flexible substrate and a patterned organic conductor or patterned organic semiconductor element on a first side of the flexible substrate; a second electrical element comprising a second substrate and an element selected from patterned organic conductor elements, patterned inorganic conductor elements and patterned semiconductor elements, on a first side of a second substrate; and a coating composition in contact with the patterned organic conductor or patterned organic semiconductor element of the first electrical element and the patterned organic conductor element, patterned inorganic conductor element or patterned semiconductor element of the second electrical element, wherein the coating composition comprises an adhesive and a plurality of conductive particles dispersed within the adhesive, and wherein the average diameter of the conductive particles is greater than the thickness of the coating and the conductive particles fill less than about 50 percent of the volume of the coating composition.

Suitable flexible substrates include polymeric films and sheets; and insulator-coated metal foils, films or sheets. Suitable polymeric films or sheets can comprise polyesters, polyamides, polyolefins, polycarbonates, polyimides and polyethersulphones. Films made from PET (polyethyleneterephthalate), PEN (polyethylene-naphthalate), or Kapton® (available from E.I. DuPont de Nemours and Co., Wilmington, Del.) are examples of suitable substrates. The flexible substrates can also be made from copolymers or polymer blends, or can be multi-layer systems, such as laminates.

Flexible substrates can also be used for the second substrate. Alternatively, the second substrate can be a rigid substrate, such as glass, insulator-coated metal, or a polymeric substrate that is thick enough to be rigid, or is reinforced with, e.g., fiberglass, to make it rigid.

The patterned organic conductor or patterned organic semi-conductor element on the first side of the flexible substrate can be made by any of several means. For example, it can be made by additive processes such as screen printing, lamination, or thermal transfer, or by subtractive processes such as etching or laser ablation. The patterned organic conductor elements, patterned inorganic conductor elements and patterned semiconductor elements, on the first side of a second substrate can be produced by similar means, independently chosen from the method to create the pattern on the first flexible substrate.

Suitable organic semi-conductors include polythiophenes, pentacene, sexithiophene, and substituted acenes.

Suitable organic conductors include doped polyaniline, doped polythiophene, doped polypyrrole, and carbon nanotubes or carbon black dispersed in an organic matrix.

Suitable inorganic conductors include Sc, Ti, V, Cr, Mn, Fe, Co, Ni, Cu, Zn, Y, Zr, Nb, Mo, Ru, Rh, Pd, Ag, La, Hf, Ta, W, Re, Os, Ir, Pt, Au and alloys thereof, indium tin oxide, antimony oxide, and rhenium oxide.

Suitable inorganic semi-conductors include silicon, Ge, III/V semiconductors, and II/VI semiconductors.

Suitable adhesives for use in the coating composition include non-conductive materials having a low $T_g$. The optimal $T_g$ for a given application or device depends in part on the desired final thickness of the adhesive. For example, if the desired thickness is 1 µm, the adhesive should have a $T_g$ less than about 0° C.

The adhesive can comprise photocurable adhesives materials, thermocurable adhesive materials, or thermoplastic adhesive materials. Suitable photocurable adhesive materials include acrylic resins, epoxy resins, and unsaturated hydrocarbon resins. Suitable thermocurable adhesive materials include epoxy resins, acrylic resins, polyester resins, and melamine resins. Suitable thermoplastic adhesive materials include acrylic resins, olefin resins and styrenic resins. Copolymers of thermoplastic adhesive materials can also be used. Mixtures of photocurable adhesive materials, thermocurable adhesive materials and/or thermoplastic adhesive materials can be used.

Suitable conductive particles include particles of conductive metals, as well as inorganic or organic particles coated with a conductive layer. Suitable metals include Sc, Ti, V, Cr, Mn, Fe, Co, Ni, Cu, Zn, Y, Zr, Nb, Mo, Ru, Rh, Pd, Ag, La, Hf, Ta, W, Re, Os, Ir, Pt, Au, In, Pb and alloys thereof. Suitable inorganic materials for coated particles include metal oxides, for example, aluminum oxide and silicon dioxide. Suitable conductive layers, coating the inorganic particles, include metals, their alloys, indium tin oxide, antimony oxide, and rhenium oxide. Suitable organic materials for coated particles include polyesters, polyamides, polyimides, polycarbonates, polystyrenes, polyolefins, polyurethanes, and polyacrylates.

The average diameter of conductive particles ranges from 0.1 microns to 100 microns. The average diameter of the conductive particle is preferably larger (e.g., about 1.5-3× larger) than the desired final thickness of the anisotropic conductive coating or film, so that, when pressure is applied to the assembly, the conductive particles and the non-conductive adhesive make sufficient contact with the first and second elements.

The coating composition can be made by any of several standard methods for dispersing solids into the desired adhesive. Such methods include blending, with or without the aid of solvents. If a solvent is used, it can be allowed to evaporate from the coating composition after the coating composition is coated onto the substrate. The final concentration of conductive particles in the coating composition is less than 50 volume % to ensure that the conductive particles are well separated. Preferably, the conductive particles comprise less than 30 volume %, more preferably less than about 5 volume %. The thickness of anisotropic conductive film or coating on the substrate is preferably equal to or less than the diameter of conductive particles to allow good electrical contact between the opposing portions of the patterned elements on the two substrates.

In one embodiment of the invention, the adhesive is poly (butylmethacrylate) and the conductive particles are made of silver.

In one embodiment of the invention, the average diameter of conductive particles ranges from 2 microns to 3.5 microns and the thickness of the anisotropic conductive film is 1.3 microns.

FIG. 1A is a side view of an anisotropic conductive film 100. Anisotropic conductive film 100 comprises an adhesive 102 and conductive particles 104 uniformly dispersed in adhesive 102. Anisotropic conductive film 100 is conductive in only one direction, the direction perpendicular to the film plane (the z-direction), as shown in FIG. 1A.

Figure 1B:
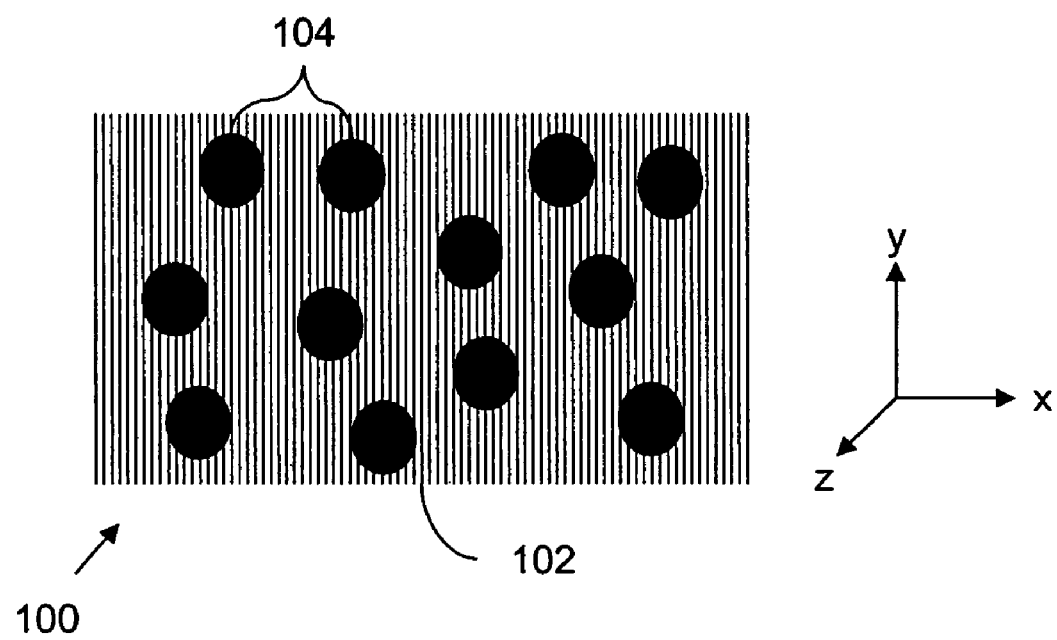

FIG. 1B is a top view of anisotropic conductive film 100.

Figure 2A:
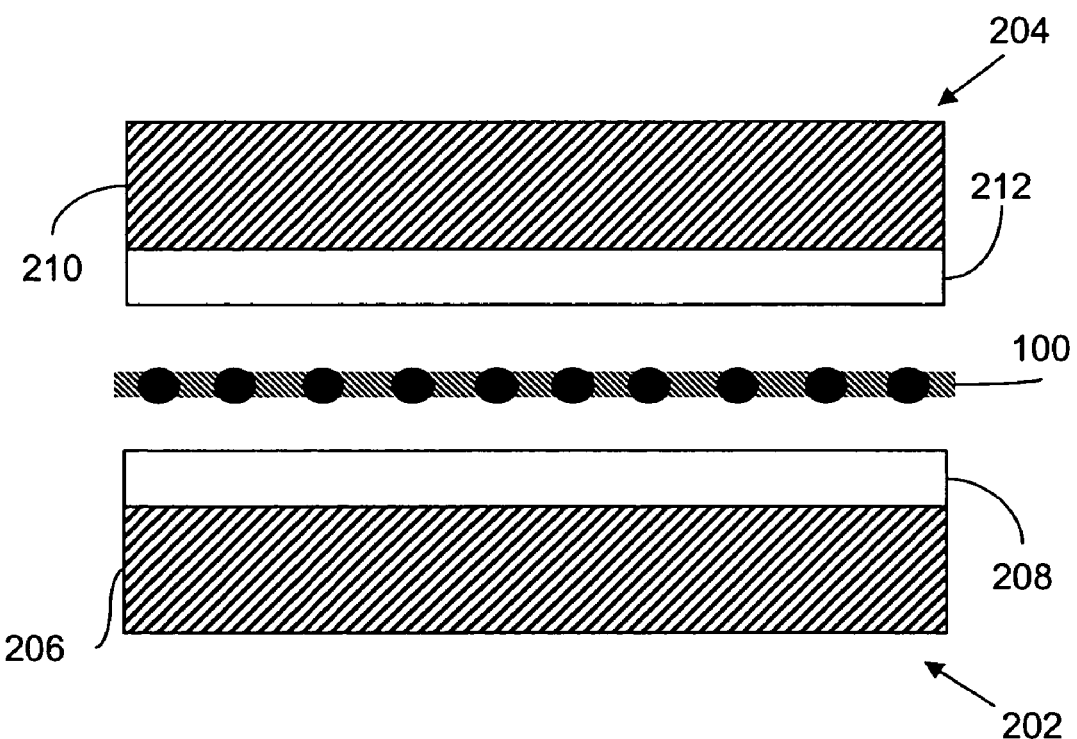
FIG. 2A depicts the system elements of the invention, in accordance with one embodiment of the invention.

FIG. 2A depicts an embodiment of the invention comprising a first multilayer 202, a second multilayer 204 and anisotropic conductive film 100. Anisotropic conductive film 100 comprises adhesive 102 and conductive particles 104. First multilayer 202 comprises two layers, namely first flexible substrate 206 and first electrical element 208. Second multilayer 204 comprises two layers, namely second flexible substrate 210 and second electrical element 212. First flexible substrate 206 and second flexible substrate 210 can comprise polymers such as polyesters, polyolefins, polyamides, polyimides and insulator-coated metal foils. First electrical element 208 can comprise a patterned organic conductor element or an organic semiconductor element. Second electrical element 212 can comprise a patterned organic or inorganic conductor element, or a patterned organic or inorganic semiconductor element.

Figure 2B:
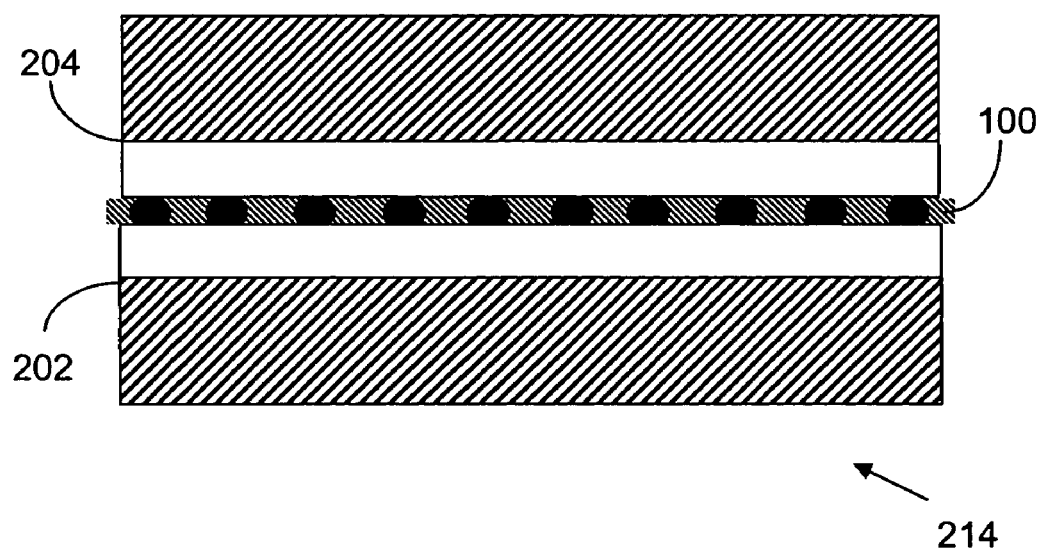
FIG. 2B depicts an assembly, in accordance with one embodiment of the invention.

FIG. 2B depicts an assembly 214. Assembly 214 is formed by interposing anisotropic conductive film or coating 100 between first multilayer 202 and second multilayer 204 and applying sufficient pressure on the layers, such that a plurality of conductive particles 104 make contact with both first electrical element 208 and second electrical element 212.

Figure 3A:
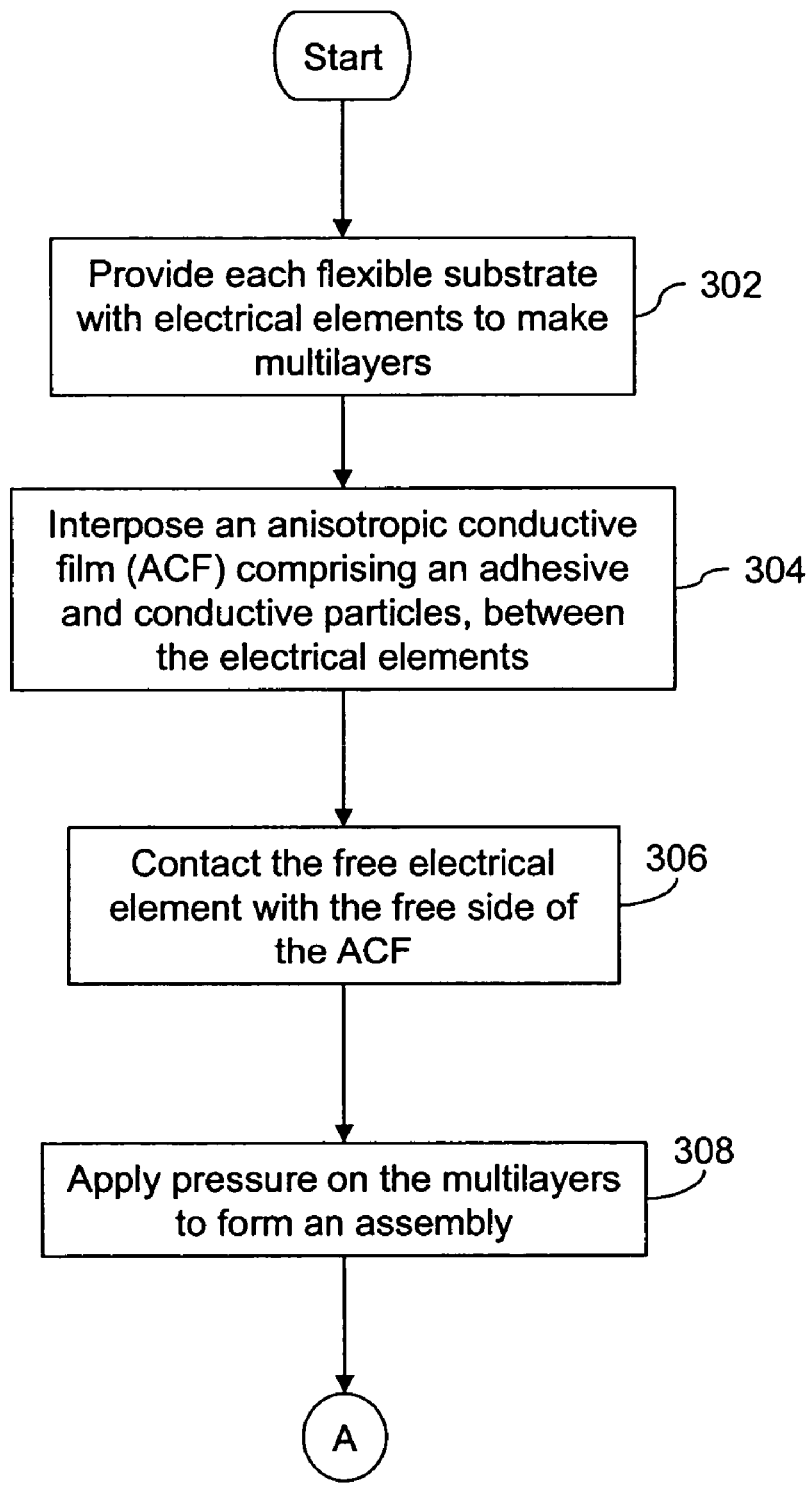
FIGS. 3A and 3B depict a flowchart describing a method for manufacturing device comprising an anisotropic conductive film.
Figure 3B:
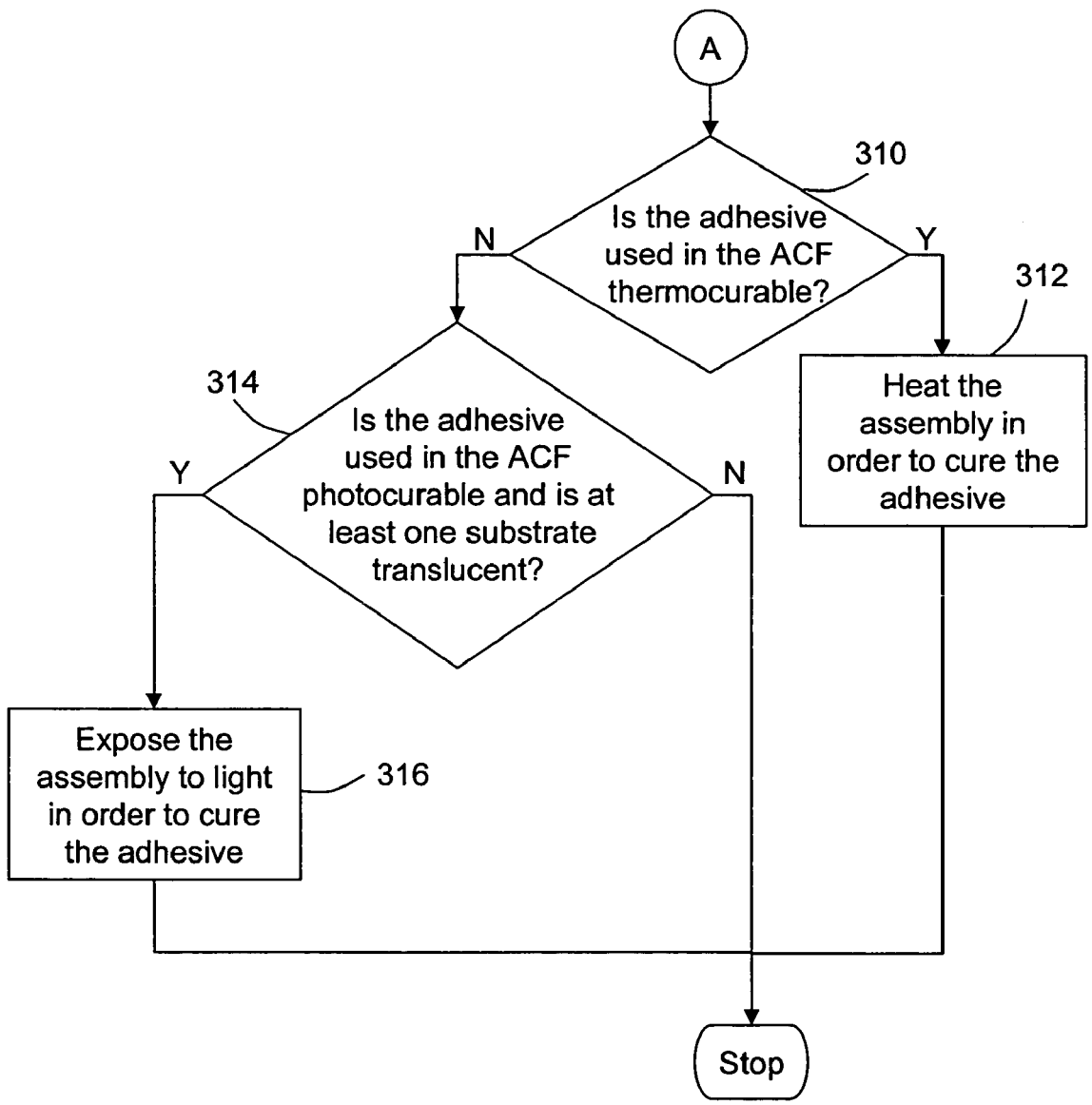

FIGS. 3A and 3B show a flowchart illustrating a method of manufacture of assembly 214. At step 302, electrical elements are provided on flexible substrates to form multilayers. Using FIG. 2A as an illustration, first electrical element 208 is provided on one side of first flexible substrate 206. Further, second electrical element 212 is provided on one side of second flexible substrate 210. At step 304, an anisotropic conductive film is interposed in between the two electrical elements provided on flexible substrates. As shown in FIG. 2A, anisotropic conductive film 100 is interposed between first electrical element 208 and second electrical element 212. At step 306, the free sides of the electrical elements are contacted with the anisotropic conductive film, one on each side. Using FIG. 2A as an illustration, first electrical element 208 is contacted with one of the free sides of anisotropic conductive film 100 and second electrical element 212 is contacted with the other free side of anisotropic conductive film 100. In one embodiment of the invention, the anisotropic conductive film is first coated onto one electrical element and then another element is brought into contact with the free side of the anisotropic conductive film. This film is coated on the electrical element using a Meyer rod.

At step 308, sufficient pressure is applied on the multilayers to form an assembly, such that a plurality of conductive particles present in the anisotropic conductive film are in contact with both the electrical elements in the system.

Using FIG. 2B as an illustration, assembly 214 is an example of the assembly formed at step 308. Assembly 214 is formed after pressure is applied on first multilayer 202 and second multilayer 204, such that at least a portion, e.g., several, conductive particles 104 make contact with both first electrical element 208 and second electrical element 212.

FIG. 3B illustrates a decision-tree for determining an optimal bonding process. At step 310, it is determined whether the adhesive used in the anisotropic conductive film is a thermocurable adhesive or not. If the adhesive is a thermocurable adhesive, step 312 can be performed.

At step 312, the assembly is heated in order to cure the adhesive. During curing, the adhesive is hardened and set. The adhesive bonds the two electrical elements and the embedded conductive particles act as a conductive media between the two electrical elements.

Referring to step 310, if the adhesive is not a thermocurable adhesive, step 314 is performed.

At step 314, it is checked whether the adhesive is a photocurable adhesive or not and whether at least one of the substrates in the assembly is translucent. If the adhesive is a photocurable adhesive and at least one of the substrates in the assembly is translucent, step 316 can be performed.

At step 316, the assembly is exposed to light in order to cure the adhesive. As mentioned above, during curing, the adhesive is hardened and set.

Figure 4:
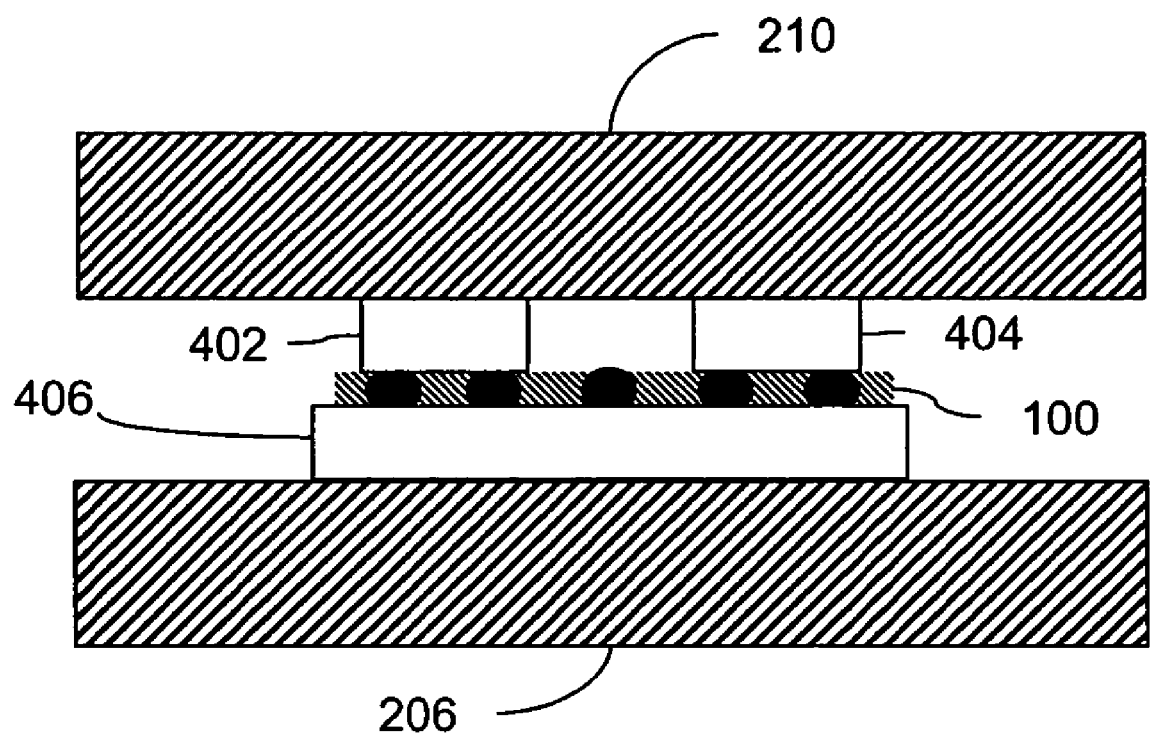
FIG. 4 is a diagram of an electronic device comprising an anisotropic conductive film, in accordance with one embodiment of the invention.

FIG. 4 shows an electronic device 400, in accordance with one embodiment of the invention. In this embodiment, electronic device 400 comprises first flexible substrate 206, second flexible substrate 210, a source electrode 402, a drain electrode 404, anisotropic conductive film 100, and bus/data lines 406 for a thin film transistor (TFT) array.

First flexible substrate 206 is provided with source electrode 402 and drain electrode 404. Second flexible substrate 210 is provided with bus/data lines 406. Anisotropic conductive film 100 is interposed between source electrode 402 and drain electrode 404, and bus/data lines 406. Anisotropic conductive film 100 is interposed in a manner, such that at least some conductive particles 104 are in contact with both source electrode 402 and bus/data lines 406, or with both drain electrode 404 and bus/data lines 406.

In another embodiment of the invention, anisotropic conductive films can be used to adhere flexible circuitry to robust circuitry. An example of flexible circuitry is TFT array backplanes on flexible substrates such as PET and Kapton®, or organic conductors such as polyaniline on flexible substrates. An example of robust circuitry is flexible connectors such as Kapton®-based via sheets or Kapton®-based circuitry. In one embodiment, an anisotropic conductive film is used to bind TFT array backplanes to via sheets. TFT array backplanes can be used in displays.

The present invention provides anisotropic conductive films that can be used in devices with flexible substrates. The films can also be used in devices with organic conductors and semiconductors. Further, the bonding process of the adhesives in the anisotropic conductive films does not require high temperatures and pressures that might damage the thin, lightweight, and flexible displays. The anisotropic conductive films provide reliable electrical or mechanical contacts between surfaces such as flexible via sheets, and flexible and fragile back planes. The anisotropic conductive films also allow small and arbitrary spacing of contact surfaces and allow the preparation of complex circuitry.

While the preferred embodiments of the invention have been illustrated and described, the invention is not limited to the embodiments only. Numerous modifications, changes, variations, substitutions, and equivalents will be apparent to those skilled in the art without departing from the spirit and scope of the invention as described in the claims.

EXAMPLES

The present invention is further defined in the following Examples. It should be understood that the Examples, while they may demonstrate preferred embodiments of the invention, are given by way of illustration only. From the above discussion and the Examples, one skilled in the art can, without departing from the spirit and scope of the invention, can make various changes and modifications of the invention to adapt it to various uses and conditions.

Polyaniline/carbon nanotube/dinonylsulfonic acid composites were prepared as described in US 2005/0116202, hereby incorporated by reference.

Example 1

Use of Anisotropic Conductive Films in Displays

A 30 wt % solution of poly(butylmethacrylate) in toluene was purchased from Sigma-Aldrich Inc. (Milwaukee, Wis.)

and used as received. Silver (Ag) powder, with a particle size distribution between 2-3.5 microns, was also purchased from Sigma-Aldrich. Ag (1.5 g) was added to 10 g of polymer solution. The solution was mixed on a roller overnight. This solution was ~5 vol % in Ag.

This solution was bar-coated onto a piece of glass using a #4 Meyer rod. Using a stylus profilometer, it was determined that the thickness of the polymer coating was ~1.3 microns. The stylus profilometer clearly showed lumps of Ag protruding from the surface. This was confirmed with optical microscopy.

The same solution was bar-coated using a #4 Meyer rod onto a via sheet consisting of a Kapton® substrate with gold pads regularly arranged in an array on either face. A small hole in the via sheet, centered on the gold pads, and having gold plating on its walls, electrically connected the gold pad on one side of the Kapton® with the corresponding pad on the other side. The height of the gold contact pads was ~60 microns above the Kapton® surface. In addition to the via pads themselves, the via sheet also contained gold circuit lines that made electrical connection to the display driver circuitry. They were also ~60 microns above the Kapton® surface. The coating was allowed to dry in air overnight.

A TFT backplane that was printed onto a PET substrate was then adhered to the via sheet by pressing with hand pressure, at room temperature. Generally, any pressure low enough to not deform the organic materials (conductor, substrate) is allowable, and this pressure is generally <~30 psi. Contact was made between the drain electrodes of the transistors in the TFT array (comprised of a polyaniline/carbon nanotube/dinonylsulfonic acid composite) and the gold contact pads on the via sheet. In addition, contact was made between the organic conductor (comprised of polyaniline/carbon nanotube/dinonylsulfonic acid composite) and the gold circuit lines that communicate with the display driver.

An electrophoretic medium (Smartpaper™, Gyricon LLC, Ann Arbor, Mich.) was adhered to the obverse side of the via sheet, and the display drivers were activated. Images were repeatedly written to the display, demonstrating that there was good electrical contact between the drain electrodes and the gold pads, and good contact between the organic conductor and the gold circuit lines. There was no undesired electrical contact because the gold lines were raised by 60 microns from the Kapton® surface. The adhesive, being only 1.3 microns thick, did not make contact between the via sheet's Kapton® substrate and the TFT array. Also, there was no evidence for x-y conductivity, i.e., conductivity in the plane of the substrate surface.

Example 2

Use of Anisotropic Conductive Films in Displays with PDLCs

A sheet of PDLC (polymer dispersed liquid crystal) purchased from Xymox Display Products (Sunnyvale, Calif.) was laminated to one side of the via sheet by heating at 85° C. in a Tetrahedron press (Tetrahedron Associates, San Diego, Calif.) under ~8 psi for 2 min. The solution of the anisotropic conductive adhesive described in Example 1 was coated directly onto the opposite face of the via sheet using a #4 Meyer rod. A printed TFT backplane was adhered to the via sheet as described in Example 1. Once again, images were repeatedly written to the display, proving that there was electrical contact between the drain electrodes of the transistors and the gold pads on the via sheet, and between the organic conductors present in the TFT array and the gold circuit lines.

What is claimed is:

1. A device comprising:
   a. a first electrical element comprising a flexible substrate and a patterned organic conductor or patterned organic semiconductor element on a first side of the flexible substrate;
   b. a second electrical element on a first side of a second substrate, wherein the second electrical element comprises:
      i. a second substrate; and
      ii. an element selected from a group consisting of patterned organic conductor elements, patterned inorganic conductor elements and patterned semiconductor elements; and
   c. a coating composition in contact with the patterned organic conductor or patterned organic semiconductor element of the first electrical element and the patterned organic conductor element, patterned inorganic conductor element or patterned semiconductor element of the second electrical element, wherein the coating composition comprises an adhesive and a plurality of conductive particles dispersed within the adhesive, and wherein the average diameter of the conductive particles is greater than the thickness of the coating and the conductive particles fill less than about 50 percent of the volume of the coating composition.

2. The device of claim 1, wherein the adhesive is selected from a group consisting of photocurable adhesives, thermocurable adhesives, and thermoplastic adhesives.

3. The device of claim 2, wherein the photocurable adhesive is selected from a group consisting of acrylic resins, epoxy resins, unsaturated hydrocarbon resins, and mixtures thereof.

4. The device of claim 2, wherein the thermocurable adhesive is selected from a group consisting of epoxy resins, acrylic resins, polyester resins, melamine resins, and mixtures thereof.

5. The device of claim 2, wherein the thermoplastic adhesive is selected from a group consisting of acrylic resins, olefin resins, styrenic resins, copolymers and mixtures thereof.

6. The device of claim 1, wherein the conductive particles comprise a metal selected from a group consisting of Sc, Ti, V, Cr, Mn, Fe, Co, Ni, Cu, Zn, Y, Zr, Nb, Mo, Ru, Rh, Pd, Ag, La, Hf, Ta, W, Re, Os, Ir, Pt, Au, In, Pb and alloys thereof.

7. The device of claim 1, wherein the conductive particles comprise inorganic particles coated with a conductive layer.

8. The device of claim 7, wherein the inorganic particles comprise a metal oxide and the conductive layer comprises a conductive material selected from a group consisting of metals, their alloys, indium tin oxide, antimony oxide and rhenium oxide.

9. The device of claim 1, wherein the average diameter of the conductive particles is about 0.1 microns to about 100 microns.

10. The device of claim 1, wherein the first electrical element comprises a patterned organic conductor and the second electrical element comprises a patterned inorganic conductor.

11. The device of claim 1, wherein the flexible substrate comprises a polymer selected from a group consisting of polyesters, polyolefins, polyamides, polyimides and insulator-coated metal foils.

12. The device of claim 1, wherein the organic semiconductor is selected from a group consisting of polythiophenes, pentacene, sexithiophene, and substituted acenes.

13. The device of claim 1, wherein the organic conductor is selected from a group consisting of doped polyaniline, doped polythiophene, doped polypyrrole, carbon nanotubes dispersed in an organic matrix, and carbon black dispersed in an organic matrix.

14. The device of claim 1, wherein the inorganic conductor is selected from a group consisting of Sc, Ti, V, Cr, Mn, Fe, Co, Ni, Cu, Zn, Y, Zr, Nb, Mo, Ru, Rh, Pd, Ag, La, Hf, Ta, W, Re, Os, Ir, Pt, Au and alloys thereof, and indium tin oxide and antimony oxide, and rhenium oxide.

15. The device of claim 1, wherein the inorganic semiconductor is selected from a group consisting of silicon, Ge, III/V semiconductors, and II/VI semiconductors.

16. A method comprising:
   a. providing a first electrical element comprising a flexible substrate and a patterned organic conductor or patterned organic semiconductor element on a first side of the flexible substrate, and a second electrical element comprising a second substrate and an element selected from patterned organic conductor elements, patterned inorganic conductor elements and patterned semiconductor elements, on a first side of a second substrate;
   b. providing a coated element by forming a coating on the patterned element of one of the first and second elements, wherein the coating comprises an adhesive and a plurality of conductive particles dispersed within the adhesive, and wherein the average diameter of the conductive particles is greater than the thickness of the coating and the conductive particles fill less than about 50 percent of the volume of the coating composition;
   c. contacting the patterned element of the other element of the first and second elements with the coating of the coated element to form an assembly; and
   d. applying sufficient pressure to the assembly so that at least a portion of the conductive particles make contact with both the patterned element of the first electrical element on the first substrate and the patterned element of the second electrical element on the second substrate.

17. The method of claim 16, wherein the adhesive is a thermocurable adhesive, and the method further comprises heating the assembly to cure the thermocurable adhesive.

18. The method of claim 16, wherein the adhesive is a thermoplastic adhesive.

19. The method of claim 16, wherein the adhesive is a photocurable adhesive and at least one of the substrates is translucent, and the method further comprises exposing the assembly to light to cure the photocurable adhesive.

20. The device of claim 10, wherein at least one patterned organic conductor element of the first electrical element serves as a source/drain contact, and at least one patterned inorganic conductor element serves as a bus-line or data-line for a thin film transistor array.

* * * * *